(12) United States Patent
Kato et al.

(10) Patent No.: US 9,670,593 B2
(45) Date of Patent: Jun. 6, 2017

(54) METHOD FOR RECHARGING RAW MATERIAL POLYCRYSTALLINE SILICON

(75) Inventors: Hideo Kato, Yamaguchi (JP); Satoko Yoshimura, Shuunan (JP); Takeshi Ninomiya, Tabuse (JP)

(73) Assignee: SILTRONIC AG, Munich (DE)

( * ) Notice: Subject to any disclaimer, the term of this patent is extended or adjusted under 35 U.S.C. 154(b) by 1541 days.

(21) Appl. No.: 13/329,368

(22) Filed: Dec. 19, 2011

(65) Prior Publication Data
US 2012/0160156 A1 Jun. 28, 2012

(30) Foreign Application Priority Data

Dec. 28, 2010 (JP) ................ 2010-294170

(51) Int. Cl.
| | |
|---|---|
| C30B 15/02 | (2006.01) |
| C30B 29/06 | (2006.01) |
| C30B 11/00 | (2006.01) |
| C30B 15/00 | (2006.01) |

(52) U.S. Cl.
CPC .............. *C30B 29/06* (2013.01); *C30B 15/02* (2013.01); *C30B 11/001* (2013.01); *C30B 15/002* (2013.01); *Y10T 117/1056* (2015.01)

(58) Field of Classification Search
CPC ....... C30B 15/02; C30B 29/06; C30B 11/001; C30B 15/002; Y10T 117/1056
USPC ......................................... 117/13, 18, 30, 33
See application file for complete search history.

(56) References Cited

U.S. PATENT DOCUMENTS

| | | | |
|---|---|---|---|
| 5,919,303 A | | 7/1999 | Holder |
| 6,106,617 A | * | 8/2000 | Yatsurugi ................ 117/214 |
| 6,110,272 A | * | 8/2000 | Aikawa et al. ............... 117/13 |
| 2003/0101924 A1 | | 6/2003 | Holder |
| 2003/0159647 A1 | * | 8/2003 | Arvidson et al. .............. 117/30 |
| 2006/0000409 A1 | * | 1/2006 | Spangler et al. ............... 117/81 |
| 2011/0036860 A1 | * | 2/2011 | Fujiwara et al. ................ 222/1 |

FOREIGN PATENT DOCUMENTS

| | | |
|---|---|---|
| CN | 1276026 A | 12/2000 |
| CN | 201261817 Y | 6/2009 |
| JP | 2005-515951 A | 6/2005 |
| JP | 2007246356 A | 9/2007 |
| JP | 2009184922 A | 8/2009 |
| JP | 2009263178 A | 11/2009 |
| JP | 2010-241620 A | 10/2010 |
| WO | 02/068732 A1 | 9/2002 |
| WO | 03/044249 A1 | 5/2003 |
| WO | 2009130943 A1 | 10/2009 |

* cited by examiner

*Primary Examiner* — Matthew Song
(74) *Attorney, Agent, or Firm* — Brooks Kushman P.C.

(57) ABSTRACT

A method for recharging raw material polycrystalline silicon which enables large chunks of polycrystalline silicon to be recharged to a CZ ingot growth process while preventing the CZ crucible from being damaged and restricting a decline of the dislocation free rate and the quality of the grown ingot. Polycrystalline silicon chunks are recharged by first forming cushioning layer silicon of smaller chunks. The cushioning layer of polycrystalline silicon chunks are deposited on a surface of the residual silicon melt in a crucible. Subsequently, large-sized polycrystalline silicon chunks are introduced onto the cushioning layer, the cushioning layer cushioning the impact due to dropping of the large-sized polycrystalline silicon chunks.

10 Claims, 6 Drawing Sheets

METHOD FOR RECHARGING RAW MATERIAL POLYCRYSTALLINE SILICON

CROSS-REFERENCE TO RELATED APPLICATION

This application claims priority to Japanese Patent Application No. JP 2010-294170 filed Dec. 28, 2010 which is herein incorporated by reference.

BACKGROUND OF THE INVENTION

1. Field of the Invention

The present invention relates to a method for recharging raw material polycrystalline silicon, particularly to a method for recharging raw material polycrystalline silicon intended for re-supplying chunks of raw material polycrystalline silicon into a crucible in a method for producing a silicon single crystal ingot (hereinafter, "ingot") using the Czochralski method (hereinafter "CZ method").

2. Description of the Related Art

A semiconductor substrate used for producing a semiconductor device is made of a single crystal silicon wafer, and the CZ method is widely used for growing silicon single crystal ingots. In the CZ method, a crucible is filled with polycrystalline silicon, and this polycrystalline silicon is melted to obtain a silicon melt. Next, a seed crystal is brought into contact with this silicon melt and an ingot is grown by pulling up the seed crystal.

It is difficult to reuse a crucible that has already been used. Therefore, in order to reduce the costs of producing an ingot, a multi-pulling technique is conventionally used wherein the polycrystalline silicon which is the raw material, is re-supplied into the crucible to compensate for the silicon melt which has decreased because of the pulling-up of the ingot, and ingots are repeatedly pulled up without exchanging the crucible.

For example, a method for recharging polycrystalline silicon by means of a cylindrical recharge tube is disclosed in WO 02/068732. This recharge tube comprises a cylindrical tube and a detachable conical valve at the lower end of this tube. In the recharge method using this recharge tube, while the tube is blocked by the conical valve, solid-state polycrystalline silicon is filled inside the tube, the recharge tube is disposed above the crucible after the ingot has been removed, the conical valve is detached to open the lower end of the tube, and the polycrystalline silicon is supplied into the crucible from the lower end of the tube.

According to this conventional recharge method, the polycrystalline silicon is dropped from the recharge tube into the silicon melt in the crucible, and therefore the silicon melt in the crucible is splashed. If the silicon melt is splashed out of the crucible, it causes damage to the ingot production apparatus, the growth process of the ingot must be stopped, and serious damage is caused to the growth process of the ingot. Further, impurities of a predetermined percentage are mixed in the silicon melt, and the splash of the silicon melt changes the impurity concentration of the silicon melt in the crucible. As a result, an ingot without the desired quality is grown, causing a degradation in quality.

Therefore, methods for preventing the silicon melt in the crucible from being splashed at the time of recharging have been conventionally disclosed.

For example, the following method is disclosed in WO 02/068732. Before the polycrystalline silicon is dropped, the output of a heater is lowered to solidify the surface of the silicon melt in the crucible. Thereafter, the output of the heater is increased and the raw material solid-state polycrystalline silicon is dropped from the recharge tube.

However, in the conventional recharge method, when large chunks of polycrystalline silicon are dropped, the impact of the dropped polycrystalline silicon cannot be cushioned. Then, the dropped polycrystalline silicon breaks through the surface of the solidified silicon melt, and the silicon melt in the crucible may be splashed, possibly stopping the production of ingots. For this reason, in the conventional recharge method, large chunks of polycrystalline silicon cannot be dropped. Large chunks of raw material polycrystalline silicon have the advantage that they can be produced at low cost and that therefore the production costs can be reduced. Further, in the case when large chunks of raw material polycrystalline silicon are used, the total surface area of the raw material polycrystalline silicon is smaller at the same weight than in the case when small chunks of polycrystalline silicon are used. As a result, $SiO_2$ on the surface of the polycrystalline silicon, impurities such as metals, and the mixing-in of atmospheric gases, etc. can be reduced. Thus, in the case of using the large chunks of the raw material polycrystalline silicon, in the grown ingot, the decline of the dislocation free rate and the quality because of contamination by impurities, formation of pinholes, etc. can be restricted.

Moreover, in the conventional recharge method, the surface of the silicon melt in the crucible is solidified. Therefore, the volume is expanded at the surface of the silicon melt and a force compressing the inner wall of the crucible is generated. This force is likely to rupture the crucible.

SUMMARY OF THE INVENTION

The objects of the present invention are to provide a method for recharging raw material polycrystalline silicon, which enables large chunks of polycrystalline silicon to be recharged while preventing the crucible from being damaged and ruptured as well as restricting the decline of the dislocation free rate and the quality of the grown ingot. These and other objects are achieved by supplying small chunks of polycrystalline silicon to form an initial cushioning layer on the silicon melt, followed by supplying larger chunks.

DETAILED DESCRIPTION OF THE PREFERRED EMBODIMENTS

The inventive method for recharging raw material polycrystalline silicon may be described as follows. It is a method for recharging raw material polycrystalline silicon in a CZ method for producing a silicon single crystal ingot comprising a filling step of filling raw material polycrystalline silicon into a crucible, a melting step of melting the filled polycrystalline silicon in the crucible to form a silicon melt, and a pulling-up step of bringing a seed crystal into contact with the silicon melt and pulling up the seed crystal to thereby grow a silicon single crystal ingot, in which further raw material polycrystalline silicon is supplied into the crucible after the melting step and the pulling-up step; wherein a cushioning region is formed by introducing small polycrystalline silicon chunks having small sizes to the surface of the silicon melt in the crucible, and large polycrystalline silicon chunks being larger in size than the small polycrystalline silicon chunks are supplied onto the cushioning region.

In the method for recharging raw material polycrystalline silicon according to the present invention, the small polycrystalline silicon chunks have sizes of 5 mm to 50 mm, more preferably from 5 mm to less than 20 mm. In another embodiment, the small polycrystalline silicon chunks have sizes of 20 mm to 50 mm.

In the method for recharging raw material polycrystalline silicon according to the present invention, a recharge device comprising a main body having a passageway running through it and a lid body enabling one end of the main body to be opened and closed, is used to supply the raw material polycrystalline silicon to the silicon melt in the crucible. In the method for recharging raw material polycrystalline silicon according to the present invention, the large polycrystalline silicon chunks have sizes which allow the large polycrystalline silicon chunks to pass through the passageway of the main body, and which are larger than 50 mm.

In the method for recharging raw material polycrystalline silicon according to the present invention, the one end of the main body of the recharge device is closed by the lid body, the small polycrystalline silicon chunks are filled into the main body, the large polycrystalline silicon chunks are filled onto the small polycrystalline silicon chunks filled into the main body, and the lid body is opened to supply the raw material polycrystalline silicon to the silicon melt in the crucible.

According to the method for raw material recharging polycrystalline silicon according to the present invention, even when the large chunks of raw material polycrystalline silicon are recharged, the cushioning region formed on the surface of the silicon melt in the crucible functions as an impact cushioning member, whereby it is capable of preventing the silicon melt in the crucible from being splashed and of preventing the crucible from being damaged or ruptured. Further, the large chunks of polycrystalline silicon can be recharged without splashing the silicon melt, and this makes it possible to prevent the dislocation free rate and the quality of the grown ingot from declining. Moreover, since the large chunks of raw material polycrystalline silicon can be produced at low cost, the advantage can be obtained that the production costs for the ingot can be reduced.

The present invention will be explained below with reference to the drawings showing preferred embodiments thereof.

Figure 1:
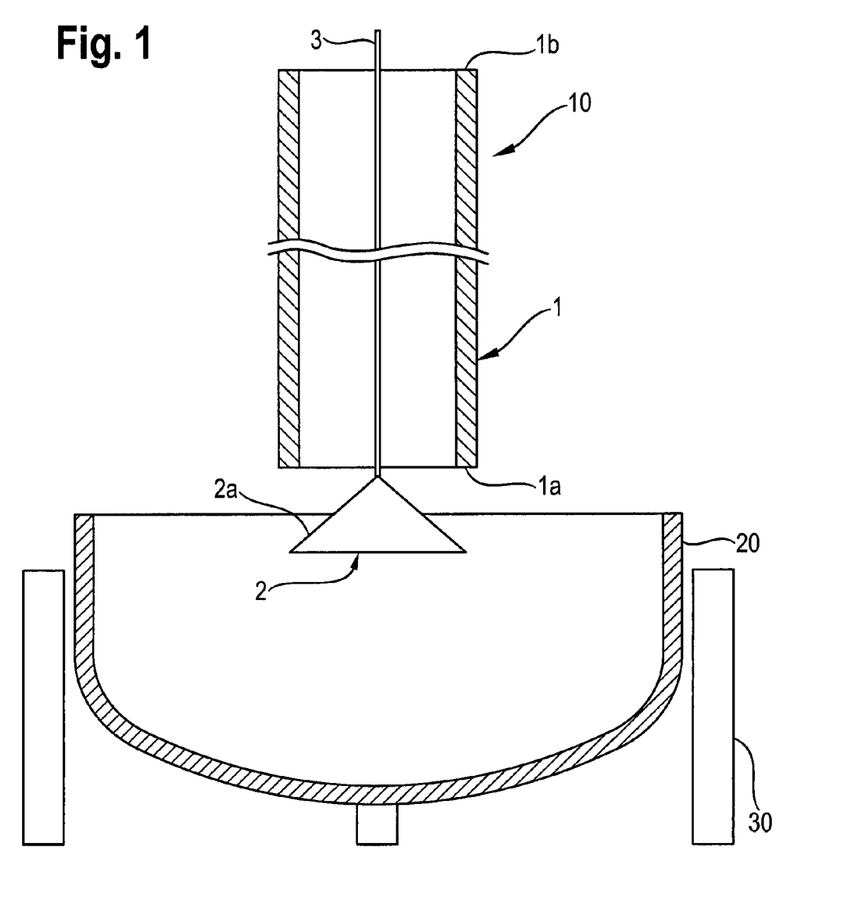
FIG. 1 is a sectional view illustrating a recharge device for implementing a method for recharging raw material polycrystalline silicon according to an embodiment of the present invention.

FIG. 1 is a sectional view showing a recharge device for carrying out the method for recharging raw material polycrystalline silicon according to an embodiment of the present invention.

As shown in FIG. 1, a recharge device 10 is disposed above a crucible 20 arranged inside an ingot production apparatus which is not shown in the drawings. In the ingot production apparatus, the CZ method is performed. In the CZ method, polycrystalline silicon which is the raw material, is filled into the crucible, and the polycrystalline silicon filled into the crucible is melted to form a silicon melt in an atmosphere of an inert gas, e.g. Ar gas. A seed crystal is brought into contact with the silicon melt and an ingot is grown by pulling up the seed crystal. As shown in FIG. 1, the crucible 20 is surrounded on its outer periphery by a heater 30. The heater 30 is used for heating the inside of the crucible 20 and melting the chunks of the polycrystalline silicon (hereinafter also referred to as "polycrystalline silicon chunks"). The crucible 20 is e.g. a crucible made of quartz and the heater 30 is e.g. a graphite heater.

The recharge device 10 has a hollow cylindrical main body 1 having a through passageway with both ends 1a, 1b opening externally, and a lid body 2 enabling one end of the main body to be opened and closed. The main body 1 is made of e.g. quartz. The lid body 2 has a conical shape with a conical surface 2a, which can come into close contact with the periphery of the end 1a. A wire 3 is attached to the lid body 2, and the wire 3 runs through the inside of the main body 1 from the end 1a to the end 1b to be connected to a non-illustrated open/close device of the recharge device 10. It should be noted that the shape of the main body 1 is not limited to the cylindrical shape and that other shapes such as a column shape can be adopted. Similarly, for the shape of the lid body 2, other shapes such as a pyramid shape can be adopted.

In the recharge device 10, the opening and closing of the end 1a of the main body 1 is performed by the non-illustrated open/close device letting out and reeling in the wire 3, thus vertically moving the lid body 2.

Figures 2, 2C:
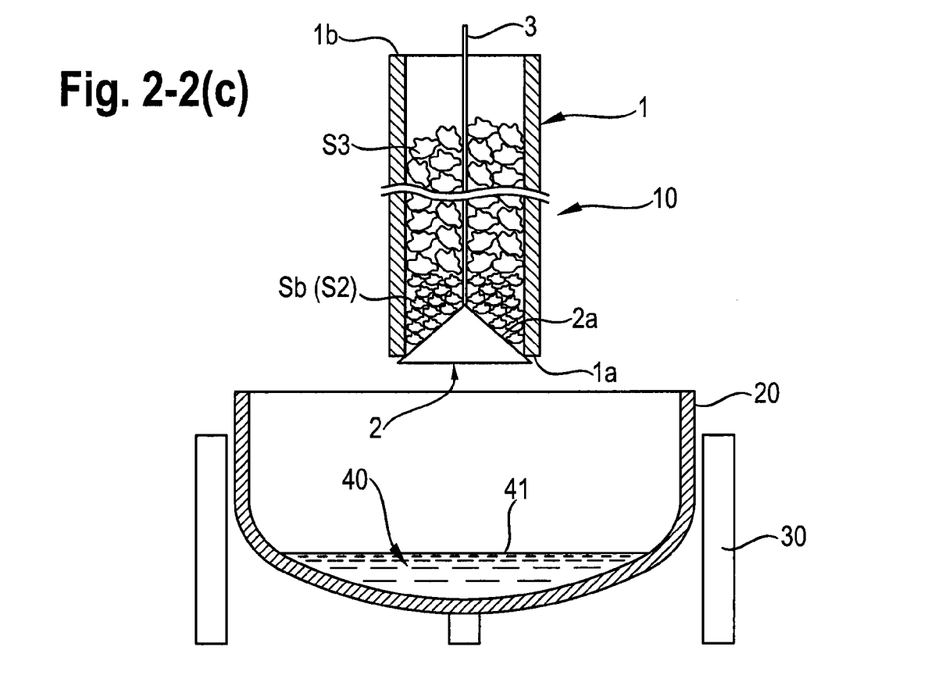
FIG. 2 are views illustrating a method for recharging raw material polycrystalline silicon according to a first embodiment of the present invention.
Figures 2, 3E:
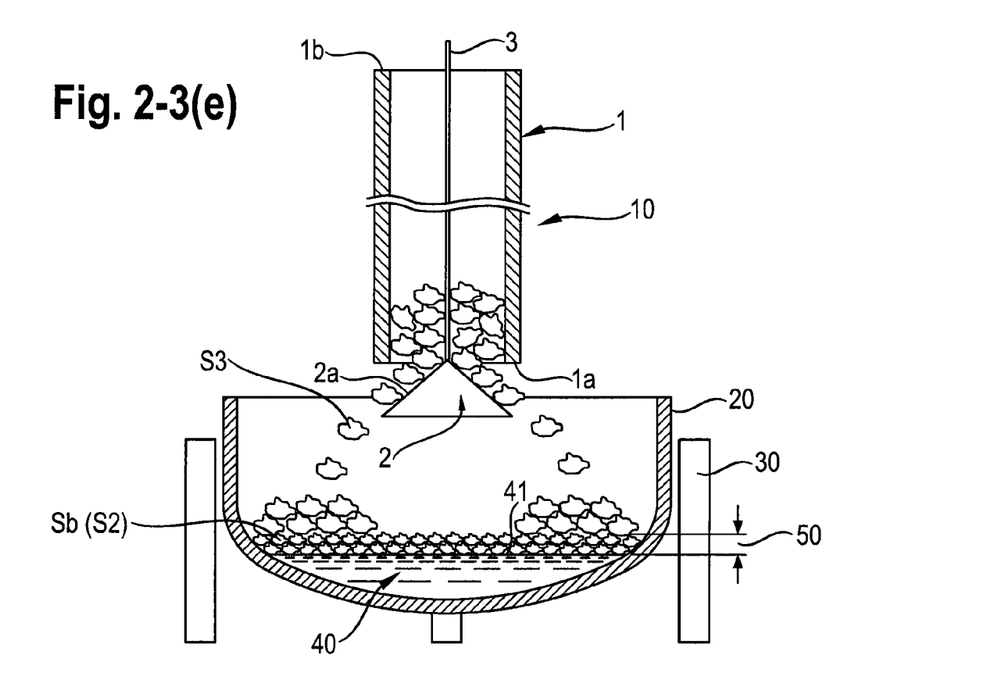
Figures 2, 3F:
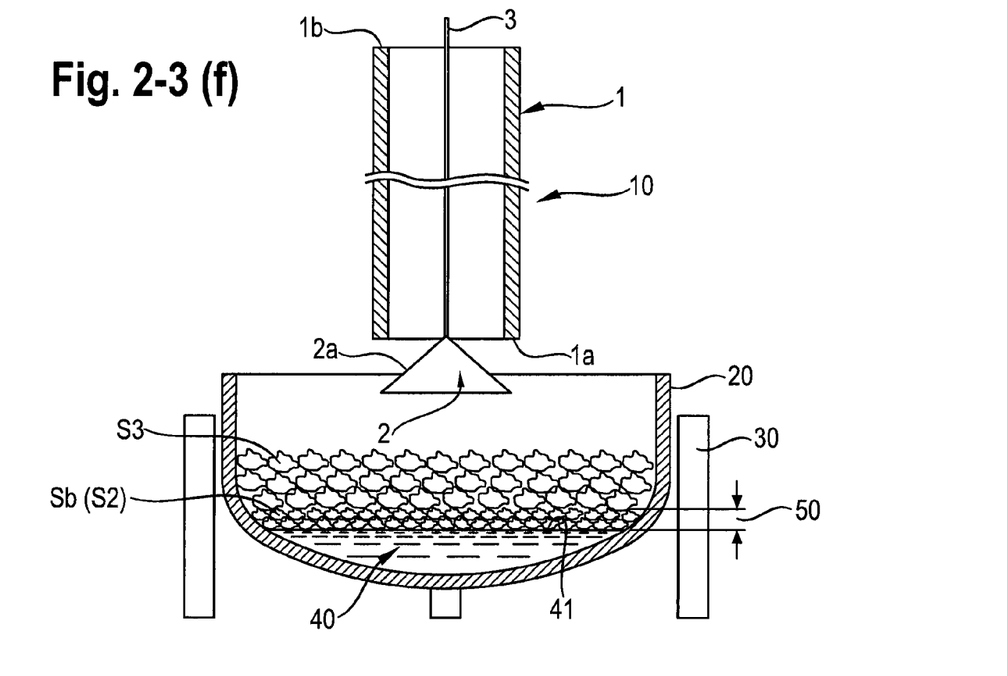

The method for recharging raw material polycrystalline silicon according to the first embodiment of the present invention using the above recharge device 10, will be explained below. FIGS. 2(a) to (f) show the method for recharging raw material polycrystalline silicon according to the first embodiment of the present invention.

Figure 3:
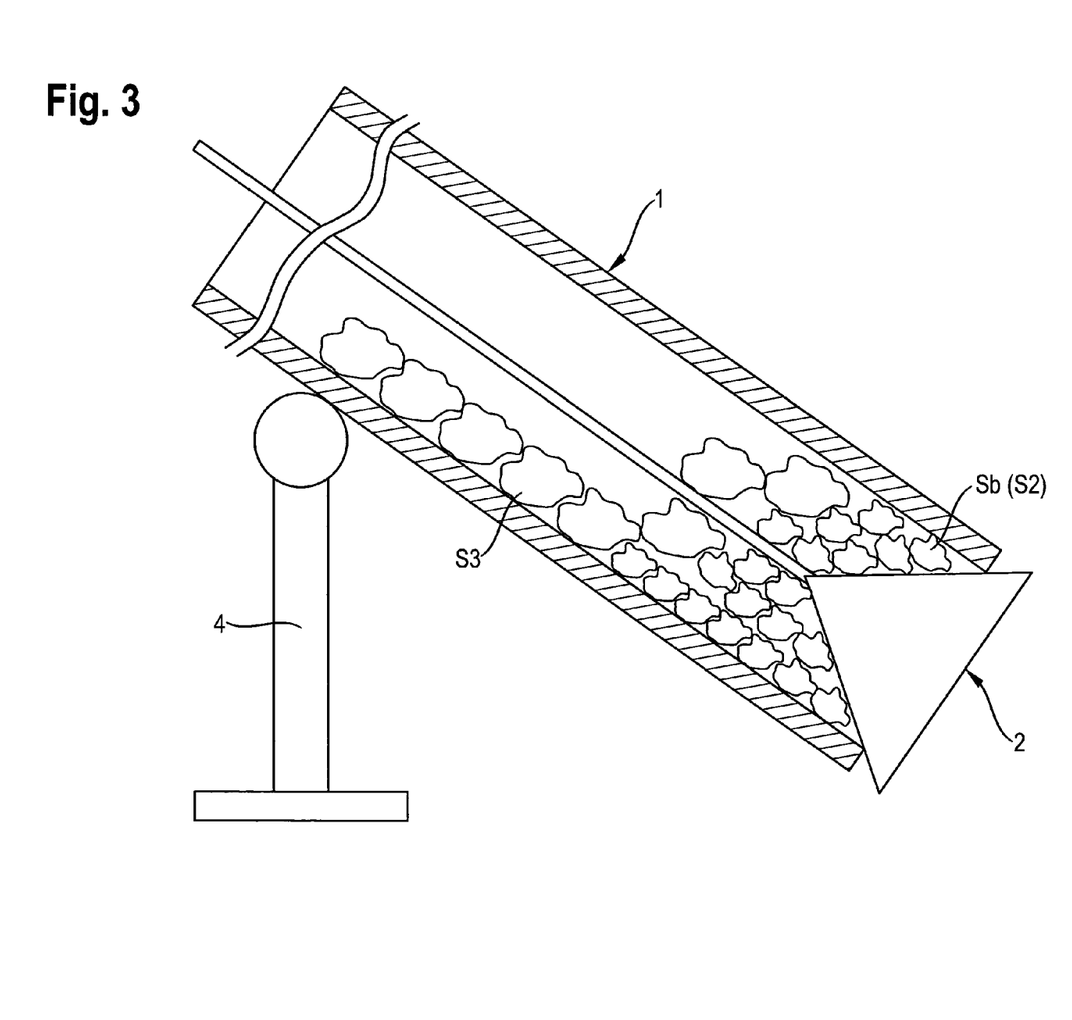
FIG. 3 is a view illustrating one example of an arrangement of a main body of the recharge device.

During the growth of an ingot, the recharging is performed after the step of melting the polycrystalline silicon chunks or the step of pulling up the ingot. First, the end 1a of the main body 1 of the recharge device 10 is closed by the lid body 2. Next, the raw material polycrystalline silicon is filled into the main body 1. While the raw material polycrystalline silicon is filled, the recharge device 10 takes a posture in such a manner that, for example, the axial direction of the main body 1 is oriented in a vertical direction. Further, as shown in FIG. 3, the recharge device 10 can take a posture in such a manner that, by means of e.g. a support body 4, the main body 1 can be inclined so that the axial direction of the main body 1 assumes a predetermined angle, e.g. 45 degrees, with respect to the vertical direction.

Figure 4:
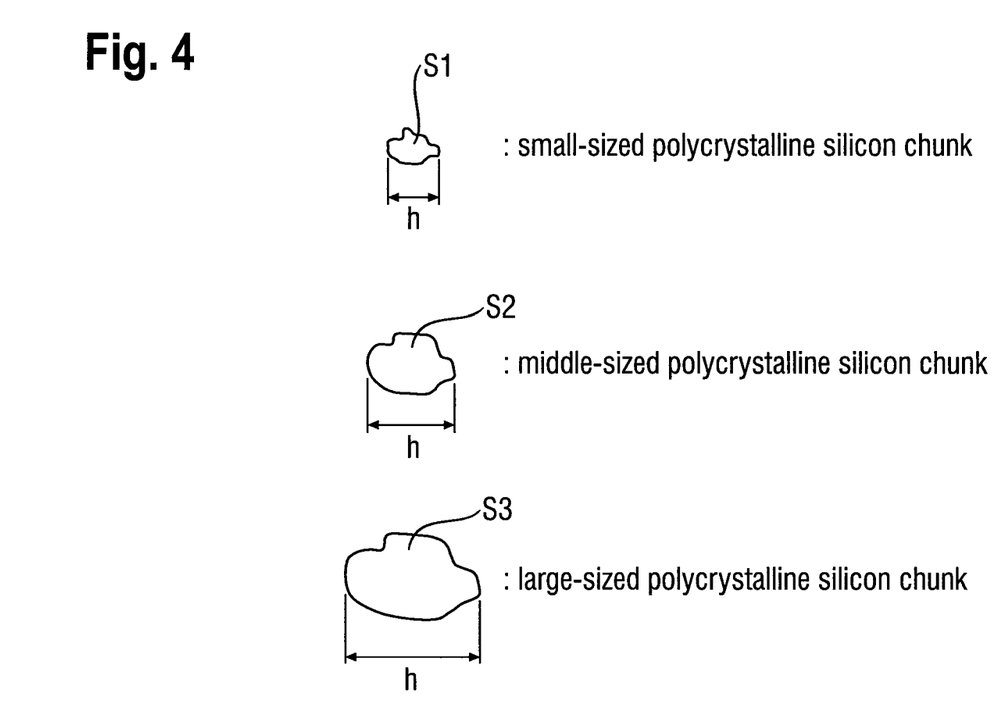
FIG. 4 is a view illustrating types of polycrystalline silicon chunks as raw material.

Here, depending on their sizes, the polycrystalline silicon chunks as the raw material polycrystalline silicon is divided into three classes: small-sized polycrystalline silicon chunks S1, middle-sized polycrystalline silicon chunks S2, and large-sized polycrystalline silicon chunks S3. As shown in FIG. 4, the small-sized polycrystalline silicon chunks S1 are polycrystalline silicon chunks having a small chunk size, the middle-sized polycrystalline silicon chunks S2 are polycrystalline silicon chunks having a middle chunk size, and the large-sized polycrystalline silicon chunks S3 are polycrystalline silicon chunks having a large chunk size. The size of the chunks is defined by the maximum width h of the chunks. Polycrystalline silicon chunks with a maximum width h of less than 20 mm are small-sized polycrystalline silicon chunks S1. Polycrystalline silicon chunks with the maximum width h of 20 mm to 50 mm are middle-sized polycrystalline silicon chunks S2. Polycrystalline silicon chunks with the maximum width h of more than 50 mm are large-sized polycrystalline silicon chunks S3.

As shown in FIG. 2(b), the filling of the raw material polycrystalline silicon into the main body 1 initially starts with cushioning layer formation polycrystalline silicon chunks Sb for forming a cushioning layer described later. As the cushioning layer formation polycrystalline silicon chunks Sb, the small-sized polycrystalline silicon chunks S1 or the middle-sized polycrystalline silicon chunks S2 are used. Namely, the small-sized polycrystalline silicon chunks S1 or the middle-sized polycrystalline silicon chunks S2 are filled into the main body 1 which has not yet been filled with raw material polycrystalline silicon. The amount of the cushioning layer formation polycrystalline silicon chunks Sb to be filled is based on the diameter of the crucible 20 or the like, and the surface 41 of the silicon melt 40 in the crucible 20 is preferably entirely covered with the cushioning layer formation polycrystalline silicon chunks Sb. In the present embodiment, the middle-sized polycrystalline silicon chunks S2 are used as the cushioning layer formation polycrystalline silicon chunks Sb.

Next, as shown in FIG. 2(c), polycrystalline silicon chunks being larger in size than the middle-sized polycrystalline silicon chunks S2, namely, the large-sized polycrystalline silicon chunks S3, are filled into the main body 1. Thus, the middle-sized polycrystalline silicon chunks S2 are deposited inside the main body 1 from the lower end 1a, and subsequently, the large-sized polycrystalline silicon chunks S3 are deposited on the middle-sized polycrystalline silicon chunks S2, said chunks S3 being larger in size than the chunks S2.

While the polycrystalline silicon chunks are filled into the main body 1, as described above, the main body 1 may be inclined at a predetermined angle with respect to the vertical direction, as shown in FIG. 3. In this manner, it is possible to cushion the impact of the polycrystalline silicon chunks on the main body 1 when the polycrystalline silicon chunks are filled into the main body 1. Particularly when the large-sized polycrystalline silicon chunks S3 are filled, the middle-sized polycrystalline silicon chunks S2 which were deposited on the bottom of the main body 1 beforehand, cushion, as the cushioning member, the impact due to the dropping of the large-sized polycrystalline silicon chunks S3.

After the filling of the polycrystalline silicon chunks S into the main body 1 is finished, the recharge device 10 is disposed at a predetermined position above the crucible 20. As shown in FIG. 2(a), the position at which the recharge device 10 is to be disposed, is a position above the crucible 20 where the axial direction of the main body 1 coincides with the vertical direction.

Next, as shown in FIG. 2(d), the wire 3 is let out and extended by the non-illustrated open/close device so that the lid body 2 is moved downward to open the end 1a of the main body 1. In this manner, first, the middle-sized polycrystalline silicon chunks S2 deposited in the lower part of the main body 1 are supplied onto the silicon melt 40 in the crucible 20. Since the middle-sized polycrystalline silicon chunks S2 have a relatively small size, they float on the surface 41 of the silicon melt 40. For this reason, the middle-sized polycrystalline silicon chunks S2 are deposited on the surface 41 of the silicon melt 40 and cover the surface 41. Next, as shown in FIG. 2(e), the large-sized polycrystalline silicon chunks S3, which are larger than the middle-sized polycrystalline silicon chunks S2, are supplied onto the polycrystalline silicon melt 40 in the crucible 20. At this time, the lid body 2 may be further lowered in order to make the opening width of the end 1a of the main body 1 wider. Since at this time, the surface 41 of the silicon melt 40 is covered with the middle-sized polycrystalline silicon chunks S2 and the large-sized polycrystalline silicon chunks S3 drop onto the layer of the middle-sized polycrystalline silicon chunks S2 floating on the surface 41 of the silicon melt 40, the impact due to the dropping of the large-sized polycrystalline silicon chunks S3 is cushioned by the layer of the floating middle-sized polycrystalline silicon chunks S2. Namely, the middle-sized polycrystalline silicon chunks S2, which are supplied into the crucible 20 first, are deposited on the surface 41 of the polycrystalline silicon melt 40 and form a cushioning layer 50. Then, as shown in FIG. 2(f), all the polycrystalline silicon chunks filled inside the main body 1 of the recharge device 10 are supplied into the crucible 20, and the recharging is finished.

The recharged polycrystalline silicon chunks are melted due to being heated by the heater 30, and become the silicon melt. In this manner, the desired amount of silicon melt is supplied into the crucible 20.

Next, a method for recharging raw material polycrystalline silicon according to a second embodiment of the present invention will be explained.

The method for recharging raw material polycrystalline silicon according to the second embodiment of the present invention is different from the first embodiment only in that, as the cushioning layer, for polycrystalline silicon chunks Sb, not the middle-sized polycrystalline silicon chunks S2 but the small-sized polycrystalline silicon chunks S1 are used. Namely, in the second embodiment of the present invention, the small-sized polycrystalline silicon chunks S1 form the cushioning layer 50 on the surface 41 of the silicon melt 40 in the crucible 20, and the large-sized polycrystalline silicon chunks S3 are supplied onto this cushioning layer 50. The method for recharging according to the second embodiment of the present invention is different from the method for recharging according to the first embodiment only in that the small-sized polycrystalline silicon chunks S1 are used for forming cushioning layer Sb. Since the remaining processes are the same between both methods, their detailed explanation will be omitted.

Next, the method for supplying raw material polycrystalline silicon from the main body 1 to the crucible 20 in the first and second embodiments of the present invention will be explained. It is preferable that, by adjusting the length of the wire 3, the cushioning layer formation polycrystalline silicon chunks Sb, which are the small-sized polycrystalline silicon chunks S1 or the middle-sized polycrystalline silicon chunks S2, are first supplied into the crucible 20, resulting in cushioning layer formation of polycrystalline silicon chunks Sb are supplied into the crucible 20 so that the cushioning layer 50 consisting of polycrystalline silicon chunks Sb is formed on the surface 41 of the silicon melt 40. Thereafter, the large-sized polycrystalline silicon chunks S3 are introduced onto the cushioning layer 50. For example, when the polycrystalline silicon chunks are supplied from the main body 1 to the crucible 20, first, the lid body 2 may be lowered to open the end 1a of the main body 1 by a width which allows the cushioning layer formation polycrystalline silicon chunks Sb to pass and prevents the large-sized polycrystalline silicon chunks S3 from passing, and then, after all the cushioning layer formation polycrystalline silicon chunks Sb filled are supplied into the crucible 20, the lid body 2 is further lowered to allow the large-sized polycrystalline silicon chunks S3 to pass.

As to the amount of the polycrystalline silicon chunks filled into the main body 1 of the recharge device 10, it is preferable that the total amount of the cushioning layer formation polycrystalline silicon chunks Sb and the large-size polycrystalline silicon chunks S3 corresponds to the desired amount of the polycrystalline silicon to be recharged.

When, as described above, the polycrystalline silicon chunks are recharged in the methods for recharging according to the embodiments of the present invention, the small-sized polycrystalline silicon chunks S1 or the middle-sized polycrystalline silicon chunks S2 are introduced first and deposited on the surface 41 of the silicon melt 40 in the crucible 20 to thereby form the cushioning layer 50. When the large-sized polycrystalline silicon chunks S3, which have large sizes, are subsequently introduced onto the cushioning layer 50, the cushioning layer 50 cushions the impact due to the dropping of the large-sized polycrystalline silicon chunks S3. This can prevent the silicon melt 40 in the crucible 20 from being splashed due to the impact of the dropping of the large polycrystalline silicon chunks.

By forming the cushioning layer 50, it is possible to recharge the large-sized polycrystalline silicon chunks S3, which have sizes so large that they could not have been recharged conventionally, without splashing the silicon melt 40.

Further, the cushioning layer 50 is formed of the small-sized polycrystalline silicon chunks S1 or the middle-sized polycrystalline silicon chunks S2 floating on the silicon melt 40. Forming the cushioning layer 50 prevents forces from being applied to the crucible 20, and therefore the crucible 20 is neither damaged nor ruptured.

As described above, according to the methods for recharging of the embodiments of the present invention, in the case of recharging the large polycrystalline silicon chunks, there is the advantage that the raw material of the large polycrystalline silicon chunks can be produced at low cost. Therefore, the costs for producing the ingot can be reduced and the total surface area of the raw material polycrystalline silicon becomes smaller, whereby $SiO_2$ on the surface of the polycrystalline silicon, impurities such as metals, and the mixing-in of atmospheric gases, etc. can be reduced. Thus, in the grown ingot, the decline of the dislocation free rate and the quality because of contamination by impurities, formation of pinholes, etc. can be restricted. Therefore, the polycrystalline silicon chunks to be recharged are preferably the large-sized polycrystalline silicon chunks, which have sizes so large that they could not have been recharged into the crucible without splashing the silicon melt in the conventional recharge method.

It is preferable that the size of the small-sized polycrystalline silicon chunks S1 as the above cushioning layer formation polycrystalline silicon chunks Sb is set to at least 5 mm in order to prevent the occurrence of defects such as the formation of pinholes in the ingot.

The maximum size of the large-sized polycrystalline silicon chunks S3 to be introduced onto the cushioning layer 50 formed in the crucible 20 is set in such a manner that the chunks S3 can pass through the passageway in the main body 1 of the recharge device 10. For example, if the diameter of the passageway of the main body 1 is 200 mm, the maximum size of the large-sized polycrystalline silicon chunks S3 is 200 mm. However, when the polycrystalline silicon chunks are introduced into the main body 1, it is preferable to consider preventing the main body 1 from being damaged due to the impact, and therefore, it is also preferable that the size of the large-sized polycrystalline silicon chunks S3 is at most 200 mm. However, the maximum size of the large-sized polycrystalline silicon chunks S3 with the prevention of damage to the main body 1 taken into consideration depends on the material and the size of the main body 1 and is not limited to the above.

EXAMPLES

Examples of the present invention will be explained below.

Polycrystalline silicon chunks were recharged by using the above method for recharging raw material polycrystalline silicon according to the first embodiment of the present invention (Examples 1-4).

In Example 1, polycrystalline silicon chunks with a maximum width h of 60 mm were used as the large-sized polycrystalline silicon chunks S3. In Example 2, polycrystalline silicon chunks with a maximum width h of 100 mm were used as the large-sized polycrystalline silicon chunks S3. In Example 3, polycrystalline silicon chunks with a maximum width h of 150 mm were used as the large-sized polycrystalline silicon chunks S3. In Example 4, polycrystalline silicon chunks with a maximum width h of 200 mm were used as the large-sized polycrystalline silicon chunks S3. In any of Examples 1-4, polycrystalline silicon chunks with a maximum width h of 50 mm were used as the middle-sized polycrystalline silicon chunks S2 being the cushioning layer formation polycrystalline silicon chunks Sb. In the recharge device 10, the diameter of the passageway in the main body 1 was slightly larger than 200 mm.

As a comparative example, the polycrystalline silicon chunks were recharged by using the conventional method for recharging raw material polycrystalline silicon (Comparative Examples 1-4). The conventional method for recharging differs from the methods for recharging according to the embodiments of the present invention in that herein, the polycrystalline silicon chunks are recharged without forming the cushioning layer. In other words, polycrystalline silicon chunks of the same size were introduced from the recharge device 10 to the crucible 20 in each example.

In Comparative Example 1, the large-sized polycrystalline silicon chunks S3 with a maximum width h of 60 mm were recharged. In Comparative Example 2, the large-sized polycrystalline silicon chunks S3 with a maximum width h of 100 mm were recharged. In Comparative Example 3, the large-sized polycrystalline silicon chunks S3 with a maximum width h of 150 mm were recharged. In Comparative Example 4, the large-sized polycrystalline silicon chunks S3 with a maximum width h of 200 mm were recharged.

As reference examples, the above conventional method for recharging raw material polycrystalline silicon was used to recharge the middle-sized polycrystalline silicon chunks S2 with a maximum width h of 30 mm (Reference Example 1) and the middle-sized polycrystalline silicon chunks S2 with a maximum width h of 50 mm (Reference Example 2).

In Examples 1-4, Comparative Examples 1-4 and Reference Examples 1, 2, the state of splashing of the silicon melt at the time of introducing the polycrystalline silicon chunks was observed. The observation results will be shown below.

TABLE 1

| | Example | | Comparative Example | | Reference Example | |
|---|---|---|---|---|---|---|
| No. | Chunk size (mm) | State of splashing | Chunk size (mm) | State of splashing | Chunk size (mm) | State of splashing |
| 1 | 60 | ○ | 60 | Δ | 30 | ○ |
| 2 | 100 | ○ | 100 | Δ | 50 | ○ |
| 3 | 150 | ○ | 150 | x | | |
| 4 | 200 | ○ | 200 | x | | |

In Table 1, the symbol "○" represents that there was no splashing of the silicon melt outside the crucible, the symbol "Δ" represents that splashing of the silicon melt outside the crucible occurred but the crucible was neither damaged nor ruptured, and the symbol "x" represents that splashing of the silicon melt outside the crucible occurred and the crucible was damaged or ruptured.

As shown in Table 1, according to the methods for recharging of the embodiments of the present invention, the large-sized polycrystalline silicon chunks S3, which are large in size, can be recharged without splashing of the silicon melt. However, in the conventional method for recharging, if the large-sized polycrystalline silicon chunks S3 are recharged, the silicon melt is splashed. Further, as clarified by the Reference Examples, when the middle-sized polycrystalline silicon chunks S2 are recharged, no splashing of the silicon melt takes place even in the case of the conventional method for recharging.

As described above, according to the method for recharging of the present invention, even when the large-sized polycrystalline silicon chunks S3, which are large in size, are recharged, no splashing of the silicon melt takes place. Therefore, it is possible to recharge the large-sized polycrystalline silicon chunks S3 which have sizes so large that they could not have been recharged conventionally, without splashing the silicon melt. It is also possible to prevent the crucible from being damaged and ruptured by the recharging and to further prevent the dislocation free rate and the quality of the grown ingot from declining. Moreover, there is the advantage that the large chunks of raw material polycrystalline silicon can be produced at low cost, and therefore, the production costs of the ingot can be reduced.

It should be noted that in the methods for recharging raw material polycrystalline silicon according to the embodiments of the present invention, the polycrystalline silicon chunks are introduced into the crucible 20 by using the recharge device 10. However the method for introducing the polycrystalline silicon chunks is not limited to this method. Any method for introducing the polycrystalline silicon chunks may be used, as long as the cushioning layer is formed as mentioned above. For example, a recharge device of a different form may be used and, further, the polycrystalline silicon chunks may be introduced without using the recharge device.

In the methods for recharging raw material polycrystalline silicon according to the embodiments of the present invention, the small-sized polycrystalline silicon chunks S1 or the middle-sized polycrystalline silicon chunks S2 are used as the cushioning layer formation polycrystalline silicon chunks Sb. However, polycrystalline silicon chunks obtained by mixing the small-sized polycrystalline silicon chunks S1 and the middle-sized polycrystalline silicon chunks S2 may also be used as the cushioning layer formation polycrystalline silicon chunks Sb.

Further, the methods for recharging raw material polycrystalline silicon according to the embodiments of the present invention can be applied to the CZ method. This CZ method is not limited to the above, so that the present invention can be applied to e.g. the MCZ method using a magnetic field as well as to materials other than silicon.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for recharging raw material polycrystalline silicon to a residual silicon melt in the CZ process for producing a silicon single crystal ingot, wherein a filling step of filling raw material polycrystalline silicon into a crucible, a melting step of melting filled polycrystalline silicon in the crucible to form a silicon melt, and a pulling-up step of bringing a seed crystal into contact with the silicon melt and pulling up the seed crystal to thereby grow a silicon single crystal ingot is used, and wherein further raw material polycrystalline silicon is supplied into the crucible after the melting step and the pulling-up step, the method comprising forming a cushioning region by introducing middle-sized polycrystalline silicon chunks having sizes of 20 mm to 50 mm and a maximum width h of 50 mm to the surface of the silicon melt in the crucible, and subsequently supplying large polycrystalline silicon chunks larger in size than the middle-sized polycrystalline silicon chunks onto the cushioning region, wherein the cushioning region entirely covers the surface of the silicon melt prior to supplying the large silicon chunks.

2. The method for recharging raw material polycrystalline silicon of claim 1, wherein a recharge device comprising a main body having a passageway running through it and a lid body enabling one end of the main body to be opened and closed, is used to supply the raw material polycrystalline silicon to the silicon melt in the crucible.

3. The method for recharging raw material polycrystalline silicon of claim 2, wherein the large polycrystalline silicon chunks have sizes which allow the large polycrystalline silicon chunks to pass through the passageway of the main body, and which are larger than 50 mm.

4. The method of claim 3, where at least some of the large polycrystalline silicon chunks have a size of 100 mm or more.

5. The method of claim 3, where at least some of the large polycrystalline silicon chunks have a size of 150 mm or more.

6. The method of claim 3, where at least some of the large polycrystalline silicon chunks have a size of 200 mm or more.

7. A method for recharging raw material polycrystalline silicon of claim 2, wherein one end of the main body of the recharge device is closed by the lid body, the middle-sized polycrystalline silicon chunks are filled into the main body, the large polycrystalline silicon chunks are filled onto the middle-sized polycrystalline silicon chunks filled into the main body, and the lid body is opened to supply the raw material polycrystalline silicon to the silicon melt in the crucible.

8. The method of claim 1, wherein at least some of the large polycrystalline silicon chunks are larger than 50 mm.

9. A method for recharging raw material polycrystalline silicon to a residual silicon melt in the CZ process for producing a silicon single crystal ingot, wherein a filling step of filling raw material polycrystalline silicon into a crucible, a melting step of melting filled polycrystalline silicon in the crucible to form a silicon melt, and a pulling-up step of bringing a seed crystal into contact with the silicon melt and pulling up the seed crystal to thereby grow a silicon single crystal ingot is used, and wherein further raw material polycrystalline silicon is supplied into the crucible after the melting step and the pulling-up step, the method comprising forming a cushioning region by introducing middle-sized polycrystalline silicon chunks having sizes of 40 mm to 50 mm and a maximum width h of 50 mm to the surface of the silicon melt in the crucible, and subsequently supplying polycrystalline silicon chunks larger in size than the middle-sized polycrystalline silicon chunks onto the cushioning region, wherein the cushioning region entirely covers the surface of the silicon melt.

10. A method for recharging raw material polycrystalline silicon to a residual silicon melt in the CZ process for producing a silicon single crystal ingot, wherein a filling step of filling raw material polycrystalline silicon into a crucible, a melting step of melting filled polycrystalline silicon in the crucible to form a silicon melt, and a pulling-up step of bringing a seed crystal into contact with the silicon melt and pulling up the seed crystal to thereby grow a silicon single crystal ingot is used, and wherein further raw material polycrystalline silicon is supplied into the crucible after the melting step and the pulling-up step, the method comprising forming a cushioning region by introducing middle-sized polycrystalline silicon chunks having sizes of 40 mm to 50 mm and a maximum width h of 50 mm to the surface of the silicon melt in the crucible, and subsequently supplying polycrystalline silicon chunks larger in size than 60 mm onto the cushioning region, wherein the cushioning region entirely covers the surface of the silicon melt.

* * * * *